(12) United States Patent
Wu

(10) Patent No.: US 10,431,174 B2
(45) Date of Patent: Oct. 1, 2019

(54) PIXEL DRIVING STRUCTURE, DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Yu Wu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/744,790

(22) PCT Filed: Jan. 8, 2018

(86) PCT No.: PCT/CN2018/071698
§ 371 (c)(1),
(2) Date: Jan. 13, 2018

(87) PCT Pub. No.: WO2019/104839
PCT Pub. Date: Jun. 6, 2019

(65) Prior Publication Data
US 2019/0164513 A1  May 30, 2019

(30) Foreign Application Priority Data
Nov. 30, 2017  (CN) .......................... 2017 1 1246125

(51) Int. Cl.
*G09G 3/36* (2006.01)
*G02F 1/133* (2006.01)
(Continued)

(52) U.S. Cl.
CPC ....... *G09G 3/3648* (2013.01); *G02F 1/13306* (2013.01); *G02F 1/136286* (2013.01); *H01L 27/3276* (2013.01)

(58) Field of Classification Search
None
See application file for complete search history.

(56) References Cited

U.S. PATENT DOCUMENTS

2014/0225819 A1  8/2014  Onuma et al.
2016/0086558 A1  3/2016  Xiao
(Continued)

FOREIGN PATENT DOCUMENTS

CN  107065354 A  8/2017
KR  10-1327839 B1  11/2013
TW  201303458 A1  1/2013

*Primary Examiner* — Kenneth B Lee, Jr.
(74) *Attorney, Agent, or Firm* — Hauptman Ham, LLP

(57) ABSTRACT

The present disclosure discloses a pixel driving structure, a display panel and a display device. The structure includes a pixel combination formed by a first pixel unit and a second pixel unit, a scan line, a data line, a gate driver and a source driver. The first pixel unit of the odd row pixel combination is connected to one odd row scan line, the second pixel unit of the odd row pixel combination is connected to the next even row scan line of the odd row scan line; the first pixel unit of the even row pixel combination is connected to the next two even row scan lines of the odd row scan line, the second pixel unit is connected to the next odd row scan line of the odd line scan line, the first pixel unit and the second pixel unit are connected to the same data line.

10 Claims, 3 Drawing Sheets

(51) Int. Cl.
*G02F 1/1362* (2006.01)
*H01L 27/32* (2006.01)

(56) References Cited

U.S. PATENT DOCUMENTS

2016/0189640 A1* 6/2016 Guo .................... G09G 3/3688
　　　　　　　　　　　　　　　　　　　　　345/694
2016/0247822 A1　　8/2016　Chen et al.
2018/0182320 A1　　6/2018　Zhu

* cited by examiner

PIXEL DRIVING STRUCTURE, DISPLAY PANEL AND DISPLAY DEVICE

RELATED APPLICATIONS

The present application is a National Phase of International Application Number PCT/CN2018/071698, filed Jan. 8, 2018, and claims the priority of China Application No. 201711246125.2, filed Nov. 30, 2017.

FIELD OF THE DISCLOSURE

The present disclosure relates to a display technology field, and more particularly to a pixel driving structure, a display panel and a display device.

BACKGROUND OF THE DISCLOSURE

Since the thin film transistor liquid crystal display (TFT-LCD) has the advantages of low radiation, small size and low energy consumption, the TFT-LCD is widely applied to various electronic information products. At the same time, people's requirements for the viewing angle of the liquid crystal display device gradually increase. At present, in order to solve the problem of large viewing angle of the liquid crystal display device, a method of alternating light and darkness using pixel units is proposed to improve the viewing angle, and a data line sharing (DLS) structure is adopted to reduce production costs in the manufacturing process.

As shown in FIG. 1a, in the existing DLS large-view pixel driving structure, the pixel units are alternately arranged brightly and darkly, the driving polarity of the data line is switched once every 14.8 microseconds. The driving voltage in combination with the data line D1 of FIG. 1b changes as follows: H+ to L+ to L+ to H+ to H− to L− to L− to H−, there is H+ to H− switching, cross pressure is larger, resulting in the source driver (SD) temperature is too high, switching point pixel unit charging rate is poor, resulting in serious dark lines. Therefore, how to design an optimal driving structure to improve the above defects existing in the prior art is a problem to be solved urgently in the industry.

SUMMARY OF THE DISCLOSURE

The technical problem to be solved by the present disclosure is to provide a pixel driving structure, a display panel and a display device, so as to solve the problems of insufficient pixel charging, excessive temperature of the source driver and poor picture quality while satisfying the large viewing angle.

In order to solve the above technical problem, one technical solution adopted by the present disclosure is:
providing a pixel driving structure, including:
pixel combinations including odd row pixel combinations and even row pixel combinations, each pixel combination including a first pixel unit and a second pixel unit;
scan lines including odd row scan lines and even row scan lines for outputting scan signals to the pixel combinations;
a data line for outputting a data signal to the pixel combination;
a gate driver connected with the pixel combination through the scan line for outputting the scan signal;
a source driver connected with the pixel combination through the data line for outputting the data signal; wherein the first pixel unit of each pixel combination of the odd row pixel combinations is connected to one odd row scan line, the second pixel unit of each pixel combination of the odd row pixel combinations is connected to the next even row scan line of the odd row scan lines; the first pixel unit of each pixel combination of the even row pixel combinations is connected to the next two even row scan lines of the odd row scan lines, the second pixel unit of the first pixel combination of the even row pixel combinations is connected to the next odd row scan line of the odd line scan lines, the first pixel unit and the second pixel unit of each pixel combination are connected to the same data line.

Another technical solution adopted by the present disclosure is:
providing a display panel including a pixel driving structure, wherein the pixel driving structure includes:
pixel combinations including odd row pixel combinations and even row pixel combinations, each pixel combination including a first pixel unit and a second pixel unit;
scan lines including odd row scan lines and even row scan lines for outputting scan signals to the pixel combinations;
a data line for outputting a data signal to the pixel combination;
a gate driver connected with the pixel combination through the scan line for outputting the scan signal;
a source driver connected with the pixel combination through the data line for outputting the data signal; wherein the first pixel unit of each pixel combination of the odd row pixel combinations is connected to one odd row scan line, the second pixel unit of each pixel combination of the odd row pixel combinations is connected to the next even row scan line of the odd row scan lines; the first pixel unit of each pixel combination of the even row pixel combinations is connected to the next two even row scan lines of the odd row scan lines, the second pixel unit of the first pixel combination of the even row pixel combinations is connected to the next odd row scan line of the odd line scan lines, the first pixel unit and the second pixel unit of each pixel combination are connected to the same data line.

In order to solve the above technical problem, the other technical solution adopted by the present disclosure is:
providing a display device, wherein the display device includes a display panel, the display panel includes a pixel driving structure, the pixel driving structure includes: pixel combinations including odd row pixel combinations and even row pixel combinations, each pixel combination including a first pixel unit and a second pixel unit;
scan lines including odd row scan lines and even row scan lines for outputting scan signals to the pixel combinations;
a data line for outputting a data signal to the pixel combination;
a gate driver connected with the pixel combination through the scan line for outputting the scan signal;
a source driver connected with the pixel combination through the data line for outputting the data signal; wherein the first pixel unit of each pixel combination of the odd row pixel combinations is connected to one odd row scan line, the second pixel unit of each pixel combination of the odd row pixel combinations is connected to the next even row scan line of the odd row scan lines; the first pixel unit of each pixel combination of the even row pixel combinations is connected to the next two even row scan lines of the odd row scan lines, the second pixel unit of the first pixel combination of the even row pixel combinations is connected to the next odd row scan line of the odd line scan lines, the first pixel unit and the second pixel unit of each pixel combination are connected to the same data line.

The beneficial effects of the present disclosure are as follows: different from the prior art, the present disclosure provides a new pixel driving structure, a display panel and a display device. Through the first pixel unit of each pixel combination of the odd row pixel combinations connected to one odd row scan line, the second pixel unit of each pixel combination of the odd row pixel combinations connected to the next even row scan line of the odd row scan lines; the first pixel unit of each pixel combination of the even row pixel combinations connected to the next two even row scan lines of the odd row scan lines, the second pixel unit of the first pixel combination of the even row pixel combinations connected to the next odd row scan line of the odd line scan lines, the first pixel unit and the second pixel unit of each pixel combination connected to the same data line to meet the large viewing angle and to solve the problem of insufficient pixel charge, the source driver temperature is too high and the picture quality is poor.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and persons of ordinary skill in the art may still derive other drawings from the accompanying drawings without creative efforts.

DETAILED DESCRIPTION OF PREFERRED EMBODIMENTS

The technical solutions in the embodiments of the present disclosure are clearly and completely described below with reference to the accompanying drawings in the embodiments of the present disclosure. Obviously, the described embodiments are only a part but not all of the embodiments of the present disclosure. All other embodiments obtained by a person of ordinary skill in the art based on the embodiments of the present disclosure without creative efforts shall fall within the protection scope of the present disclosure.

Figure 1A:
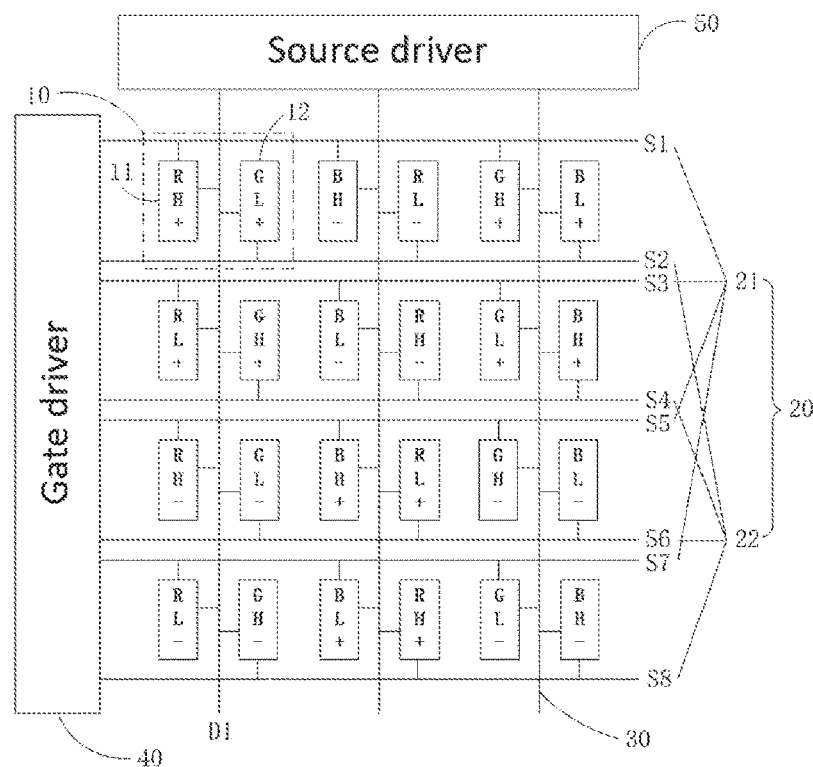
FIG. 1a is a schematic diagram of the existing DLS large-view pixel driving structure.
Figure 1B:
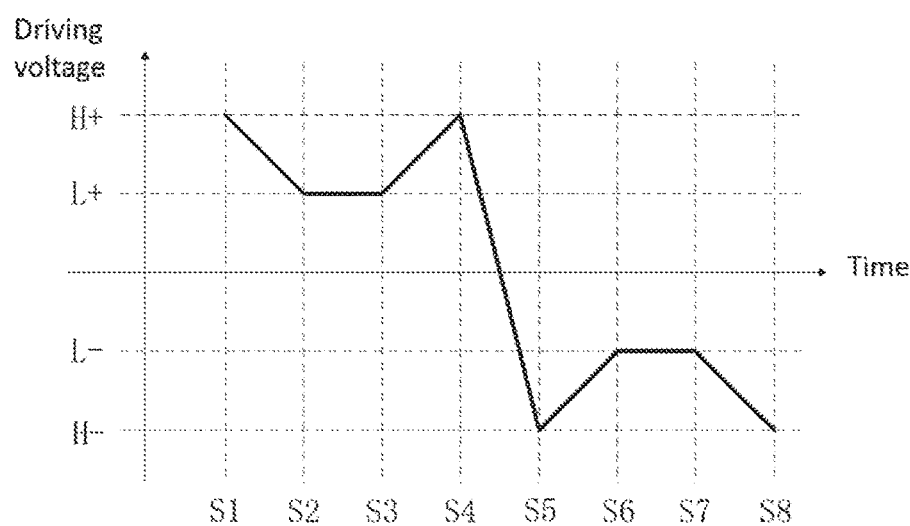
FIG. 1b is a schematic diagram of the voltage variation of the data line D1 of the existing DLS large-view pixel driving structure.
Figure 2A:
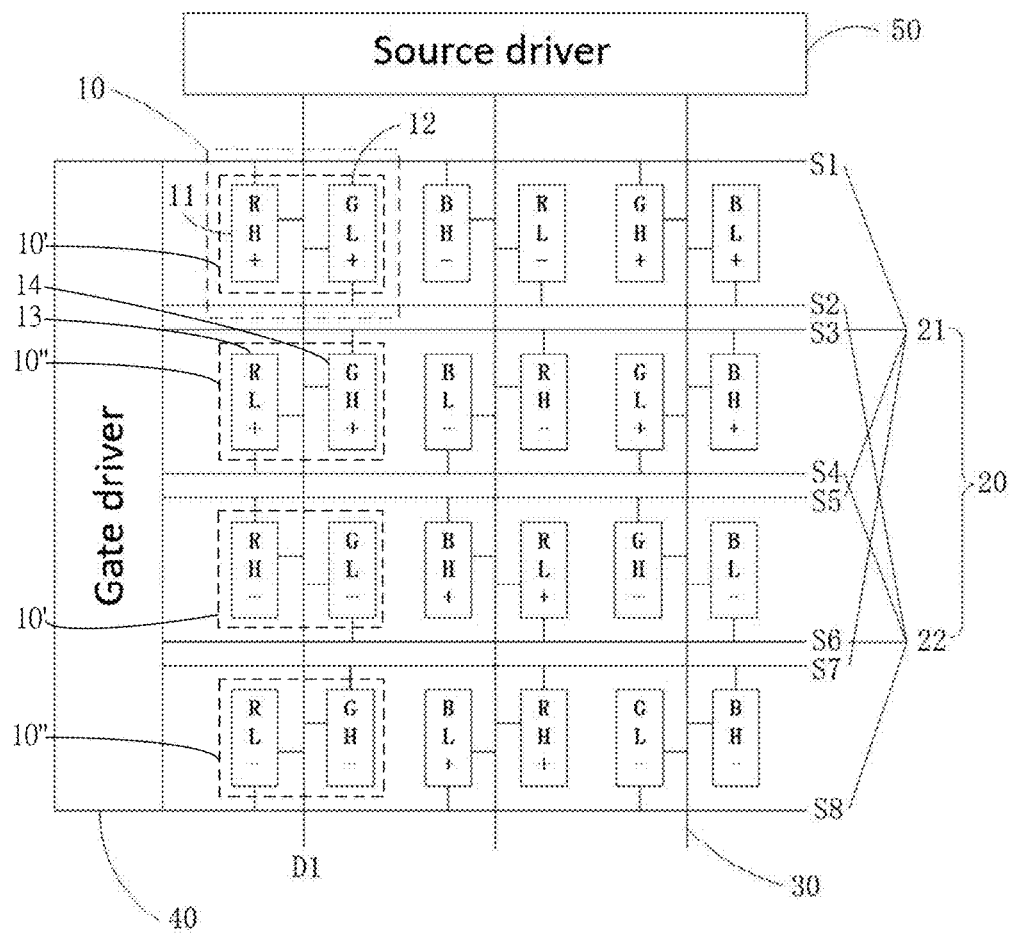
FIG. 2a is a schematic diagram of the pixel driving structure of the present disclosure.

Please referring to FIG. 2a, FIG. 2a is a schematic diagram of the pixel driving structure of the present disclosure.

The pixel driving structure includes:
pixel combinations 10 including odd row pixel combinations 10' and even row pixel combinations 10", each pixel combination including a first pixel unit 11 and a second pixel unit 12;
scan lines 20 including odd row scan lines 21 and even row scan lines 22 for outputting scan signals to the pixel combinations 10;
a data line 30 for outputting a data signal to the pixel combination;
a gate driver 40 connected with the pixel combination 10 through the scan line 20 for outputting the scan signal;
a source driver 50 connected with the pixel combination 10 through the data line 30 for outputting the data signal;
wherein
the first pixel unit 11 of each pixel combination of the odd row pixel combinations 10' is connected to one odd row scan line 21, the second pixel unit 12 of each pixel combination of the odd row pixel combinations 10' is connected to the next even row scan line 22 of the odd row scan lines 21; the first pixel unit 11 of each pixel combination of the even row pixel combinations 10" is connected to the next two even row scan lines 22 of the odd row scan lines 21, the second pixel unit 12 of the first pixel combination of the even row pixel combinations 10" is connected to the next odd row scan line 21 of the odd line scan lines 21, the first pixel unit 11 and the second pixel unit 12 of each pixel combination 10 are connected to the same data line 30. In the embodiment, the odd row scan lines (S1, S3, S5 and S7) and the even row scan lines (S2, S4, S6 and S8) are disposed alternately alone a direction in which the data line D1 extends, the odd row pixel combinations 10' and the even row pixel combinations 10" are disposed alternately alone the direction in which the data line D1 extends, wherein, one of the odd row pixel combinations and a corresponded one of the even row pixel combinations are named as a first one of the odd row pixel combinations and a first one of the even row pixel combinations. The first one of the odd row pixel combinations can be referred to anyone of the odd row pixel combinations. In one example, the odd row pixel combination 10' connected to the data line D1 and disposed between the odd row scan line S1 and the even row scan line S2 is chosen as the first one of the odd row pixel combinations, and, therefore, the even row pixel combination 10" connected to the data line D1 and disposed between the odd row scan line S3 and the even row scan line S4 is the corresponded first one of the even row pixel combinations, and, in this situation, the odd row scan line S1 is defined as a first one of the odd row scan lines, the odd row scan line S3 is defined as a second one of the odd row scan lines, the even row scan line S2 is defined as a first one of the even row scan lines and the even row scan line S4 is defined as a second one of the even row scan lines. The first pixel unit 11 of the first one of the odd row pixel combinations is connected to the first one of the odd row scan lines (i.e., odd scan line S1), the second pixel unit 12 of the first one of the odd row pixel combinations is connected to the first one of the even row scan lines (i.e., even scan line S2), the first pixel unit 13 of the first one of the even row pixel combinations is connected to the second one of the even row scan lines (i.e., even scan line S4), and the second pixel unit 14 of the first one of the even row pixel combinations is connected to the second one of the odd row scan lines (i.e., odd scan line S3), wherein the first one of the even row scan lines is next to the first one of the odd row scan lines, the second one of the odd row scan lines is next to the first one of the even row scan lines, and the second one of the even row scan lines is next to the second one of the odd row scan lines. In another example, the odd row pixel combination 10' connected to the data line D1 and disposed between the odd row scan line S5 and the even row scan line S6 is chosen as the first one of the odd row pixel combinations, and, therefore, the even row pixel combination 10" connected to the data line D1 and disposed between the odd row scan line S7 and the even row scan line S8 is the corresponded first one of the even row pixel combinations, the odd row scan line S5 is defined as the first one of the odd row scan lines, the odd row scan line S7 is defined as the second one of the odd row scan lines, the even row scan line S6 is defined as the first one of the even row scan lines and the even row scan line S8 is defined as the second one of the even row scan lines.

Figure 2B:
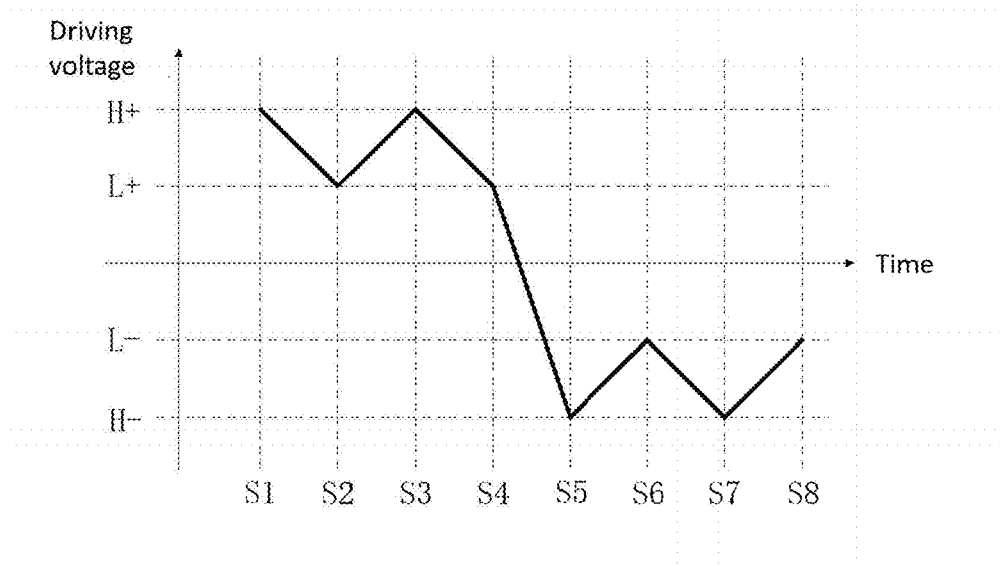
FIG. 2b is a schematic diagram of the voltage variation of the pixel driving structure data line D1 according to the present disclosure.

With reference to FIG. 2a and FIG. 2b, the driving polarity of the data signal input to the data line D1 is positive, the scan line S1 is turned on, the data line D1 inputs the data signal to control the first pixel unit 11 to be in a bright state, at this time, the voltage of the first pixel unit 11 in the bright state is H+, the scanning of the scan line S1 is completed, the scan line S2 is turned on, the data line D1 inputs the data signal to control the second pixel unit 12 to be in a dark state, at this time, the voltage of the second pixel unit 12 in the dark state is L+, the scanning of the scan line S2 is completed, the scan line S3 is turned on, the data line D1 inputs the data signal to control the second pixel unit 12 to be in a bright state, at this time, the voltage of the second pixel unit 12 in the bright state is H+, the scanning of the scan line S3 is completed, the scan line S4 is turned on, the data line D1 inputs the data signal to control the first pixel unit 11 to be in a dark state, at this time, the voltage of the first pixel unit 11 in the dark state is L+, the scanning of the scan line S4 is completed, the driving polarity of the data line D1 is switched, the scan line S5 is turned on, the data line D1 inputs the data signal to control the first pixel unit 11 to be in a bright state, at this time, the voltage of the first pixel unit 11 in the bright state is H−, scanning of the scan line S5 is completed, the scan line S6 is turned on, the data line D1 inputs the data signal to control the second pixel unit 12 to be in a dark state, at this time, the voltage of the second pixel unit 12 in the dark state is L−, the scanning of the scan line S6 is completed, the scan line S7 is turned on, the data line D1 inputs the data signal to control the second pixel unit 12 to be in a bright state, at this time, the voltage of the second pixel unit 12 in the bright state is H−, the scanning of the scan line S7 is completed, the scan line S8 is turned on, the data line D1 inputs the data signal to control the first pixel unit 11 to be in a dark state, at this time, the voltage of the first pixel unit 11 in the dark state is L−.

The driving voltage of the data line D1 changes as follows: H+ to L+ to H+ to L+ to H− to L− to H− to L−. H+ to H− switching without undercharge, only H to L or L to H switching, cross voltage reduction, to solve the problem of insufficient pixel charge rate, the source drive temperature is too high, and the picture quality is poor.

Figure 3:
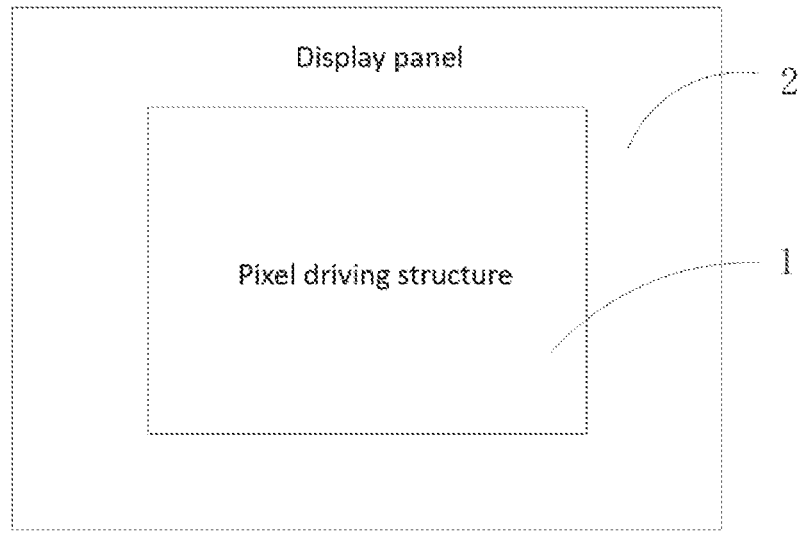
FIG. 3 is a schematic structural diagram of the display panel of the present disclosure.

Please referring to FIG. 3, FIG. 3 is a schematic structural diagram of the display panel of the present disclosure. The display panel includes the pixel driving structure described above. The other components and functions of the display panel are the same as those of the existing display panel and the functions thereof, which is not described herein again.

Figure 4:
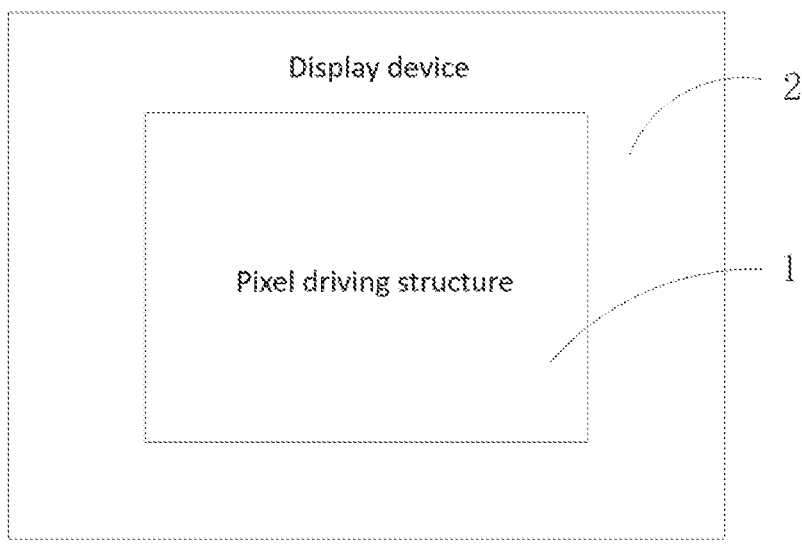
FIG. 4 is a schematic structural diagram of the display device of the present disclosure.

Please referring to FIG. 4, FIG. 4 is a schematic structural diagram of the display device of the present disclosure. The display device includes the pixel driving structure. The display device may be a liquid crystal display (LCD) or an organic light emitting display (OLED), the other devices and functions of the display device are the same as the devices and functions of the existing display device, and the details are not described herein again.

The present disclosure provides a new pixel driving structure, a display panel and a display device. Through the first pixel unit of each pixel combination of the odd row pixel combinations connected to one odd row scan line, the second pixel unit of each pixel combination of the odd row pixel combinations connected to the next even row scan line of the odd row scan lines; the first pixel unit of each pixel combination of the even row pixel combinations connected to the next two even row scan lines of the odd row scan lines, the second pixel unit of the first pixel combination of the even row pixel combinations connected to the next odd row scan line of the odd line scan lines, the first pixel unit and the second pixel unit of each pixel combination connected to the same data line to meet the large viewing angle and to solve the problem of insufficient pixel charge, the source driver temperature is too high and the picture quality is poor.

The above embodiments are merely intended for describing the technical solutions of the present disclosure, but not for limiting the present disclosure. Although the present disclosure has been described in detail with reference to the foregoing embodiments, those skilled in the art should understand that, it may still make modifications to the technical solutions described in the foregoing embodiments or make equivalent replacements to some of the technical features in the technical solutions. These modifications or replacements do not make the essence of the corresponding technical solutions depart from the spirit and scope of the technical solutions of the embodiments of the present disclosure.

What is claimed is:

1. A pixel driving structure, comprising:
   pixel combinations comprising odd row pixel combinations and even row pixel combinations, each pixel combination comprising a first pixel unit and a second pixel unit;
   scan lines comprising odd row scan lines and even row scan lines for outputting scan signals to the pixel combinations;
   a data line for outputting a data signal to the pixel combination;
   a gate driver connected with the pixel combination through the scan line for outputting the scan signal;
   a source driver connected with the pixel combination through the data line for outputting the data signal; wherein
   the odd row scan lines and the even row scan lines are disposed alternately alone a direction in which the data lines extend, the odd row pixel combinations and the even row pixel combinations are disposed alternately alone the direction;
   wherein, in a first one of the odd row pixel combinations and a first one of the even row pixel combinations which is next to the first one of the odd row pixel combinations, the first pixel unit of the first one of the odd row pixel combinations is connected to a first one of the odd row scan lines, the second pixel unit of the first one of the odd row pixel combinations is connected to a first one of the even row scan lines, the first pixel unit of the first one of the even row pixel combinations is connected to a second one of the even row scan lines, the second pixel unit of the first one of the even row pixel combinations is connected to a second one of the odd row scan lines, the first one of the even row scan lines is next to the first one of the odd row scan lines, the second one of the odd row scan lines is next to the first one of the even row scan lines, and the second one of the even row scan lines is next to the second one of the odd row scan lines.

2. The pixel driving structure according to claim 1, wherein the data line comprises a plurality of odd column data lines and a plurality of even column data lines, driving polarities of the odd column data lines are opposite to driving polarities of the adjacent even column data lines.

3. The pixel driving structure according to claim 1, wherein polarity switching frequency of each data line is 14.8 microseconds.

4. A display panel, comprising a pixel driving structure, wherein the pixel driving structure comprises:
   pixel combinations comprising odd row pixel combinations and even row pixel combinations, each pixel combination comprising a first pixel unit and a second pixel unit;
   scan lines comprising odd row scan lines and even row scan lines for outputting scan signals to the pixel combinations;
   a data line for outputting a data signal to the pixel combination;
   a gate driver connected with the pixel combination through the scan line for outputting the scan signal;
   a source driver connected with the pixel combination through the data line for outputting the data signal; wherein
   the odd row scan lines and the even row scan lines are disposed alternately alone a direction in which the data lines extend, the odd row pixel combinations and the even row pixel combinations are disposed alternately alone the direction;
   wherein, in a first one of the odd row pixel combinations and a first one of the even row pixel combinations which is next to the first one of the odd row pixel combinations, the first pixel unit of the first one of the odd row pixel combinations is connected to a first one of the odd row scan lines, the second pixel unit of the first one of the odd row pixel combinations is connected to a first one of the even row scan lines, the first pixel unit of the first one of the even row pixel combinations is connected to a second one of the even row scan lines, the second pixel unit of the first one of the even row pixel combinations is connected to a second one of the odd row scan lines, the first one of the even row scan lines is next to the first one of the odd row scan lines, the second one of the odd row scan lines is next to the first one of the even row scan lines, and the second one of the even row scan lines is next to the second one of the odd row scan lines.

5. The display panel according to claim 4, wherein the data line comprises a plurality of odd column data lines and a plurality of even column data lines, driving polarities of the odd column data lines are opposite to driving polarities of the adjacent even column data lines.

6. The display panel according to claim 4, wherein polarity switching frequency of each data line is 14.8 microseconds.

7. A display device comprising a display panel, wherein the display panel comprises a pixel driving structure, and the pixel driving structure comprises:
   pixel combinations comprising odd row pixel combinations and even row pixel combinations, each pixel combination comprising a first pixel unit and a second pixel unit;
   scan lines comprising odd row scan lines and even row scan lines for outputting scan signals to the pixel combinations;
   a data line for outputting a data signal to the pixel combination;
   a gate driver connected with the pixel combination through the scan line for outputting the scan signal;
   a source driver connected with the pixel combination through the data line for outputting the data signal; wherein
   the odd row scan lines and the even row scan lines are disposed alternately alone a direction in which the data lines extend, the odd row pixel combinations and the even row pixel combinations are disposed alternately alone the direction;
   wherein, in a first one of the odd row pixel combinations and a first one of the even row pixel combinations which is next to the first one of the odd row pixel combinations, the first pixel unit of the first one of the odd row pixel combinations is connected to a first one of the odd row scan lines, the second pixel unit of the first one of the odd row pixel combinations is connected to a first one of the even row scan lines, the first pixel unit of the first one of the even row pixel combinations is connected to a second one of the even row scan lines, the second pixel unit of the first one of the even row pixel combinations is connected to a second one of the odd row scan lines, the first one of the even row scan lines is next to the first one of the odd row scan lines, the second one of the odd row scan lines is next to the first one of the even row scan lines, and the second one of the even row scan lines is next to the second one of the odd row scan lines.

8. The display device according to claim 7, wherein the data line comprises a plurality of odd column data lines and a plurality of even column data lines, driving polarities of the odd column data lines are opposite to driving polarities of the adjacent even column data lines.

9. The display device according to claim 7, wherein polarity switching frequency of each data line is 14.8 microseconds.

10. The display device according to claim 7, wherein the display device is a LCD or an OLED.

\* \* \* \* \*